United States Patent [19]

Bobeck et al.

[11] 4,021,791
[45] May 3, 1977

[54] MAGNETIC BUBBLE PROM MEMORY

[75] Inventors: Andrew Henry Bobeck, Chatham; Robert Frederick Fischer, Livingston, both of N.J.

[73] Assignee: Bell Telephone Laboratories, Incorporated, Murray Hill, N.J.

[22] Filed: Apr. 20, 1976

[21] Appl. No.: 678,628

[52] U.S. Cl. .................................... 340/174 TF
[51] Int. Cl.² .................. G11C 11/14; G11C 21/00
[58] Field of Search .............. 340/174 PA, 174 AB, 340/174 TF, 174 SR

[56] References Cited
UNITED STATES PATENTS

| | | | |
|---|---|---|---|
| 3,618,054 | 11/1971 | Bonyhard et al. | 340/174 TF |
| 3,761,886 | 9/1973 | Kluge | 340/174 TF |

Primary Examiner—Vincent P. Canney
Attorney, Agent, or Firm—Herbert M. Shapiro

[57] ABSTRACT

A fast access, major-minor, magnetic bubble memory is provided by defining a separate set of address minor loops in addition to the minor loops of a main storage area in which data is stored. A search operation is restricted to the address loops, selected data being read out of the main storage area only after the selected address is acquired.

7 Claims, 3 Drawing Figures

MAGNETIC BUBBLE PROM MEMORY

FIELD OF THE INVENTION

This invention relates to magnetic memories and more particularly to such memories in which information is stored as magnetic bubble patterns.

BACKGROUND OF THE INVENTION

Magnetic bubble or single wall domain memories are now well known in the art. The most familiar mode of operating a bubble memory, called the "field-access" mode, utilizes a pattern of magnetic elements, typically of a magnetically soft material, in a plane next to the plane of the film in which bubbles move. The elements respond to a magnetic drive field rotating in the plane of bubble movement to produce field gradients in localized areas occupied by a pattern of bubbles. The gradients effect bubble movement in the film along channels defined by the pattern of elements.

One organization for a field-access mode bubble memory is called the "major-minor" organization. This type of organization requires that the magnetically soft elements (typically of permalloy) be arranged to form a plurality of closed loop (minor) paths for recirculating bubble patterns and a single (major) accessing channel to and from which bubble patterns are transferred for write and for read operations.

In a typical prior art multiple track memory, such as a disc file, binary words, each including data and address bits, are stored in sequence and passed by read-out heads. A selected address is applied to a comparator in a manner to provide an output only when a matching one of the sequences of addresses is applied to the comparator. In single track sequential memories, data and address bits are stored in sequence but are accessed in similar fashion. When a selected address of the sequence is found, the associated data is read out. Here, however, both data and addresses must pass the read-out head sequentially resulting in a relatively slow access time.

In the major-minor bubble memory, data moves in two directions in a plane. Consequently, there is no direct comparison between this operation and either of the multiple or single track memories. Nevertheless, the movement of data in a bubble memory from successive positions in the minor loops to the accessing (major) channel results in a sequence of data bits being compiled in the major channel and moved to a read-out position. If this data comprises address bits as well as data bits, a search-type major-minor bubble memory would have to look at all bits in memory sequentially (both data and address bits) in order to find a selected address. The access time would be slow in this case. A problem, therefore, is to provide a bubble memory operative in a search mode yet characterized by a relatively fast access time.

Information in a bubble memory, further, is often tracked by a housekeeping loop as is well known. A power failure at an inopportune time could result in the scrambling of information rendering the store inoperative unless data is rewritten. A variety of implementations is known for dealing with such a possibility. But these typically require special electronics for their realization.

BRIEF DESCRIPTION OF THE INVENTION

The realization of a fast access time for a major-minor bubble memory and the avoidance of loss of information in a housekeeping loop are achieved herein by organizing the minor loops of the memory into two sets, one for data and one for addresses. The memory is operated during a search mode to recirculate bubble patterns of both data and addresses in all the minor loops but to replicate only the addresses into the major channel. In this manner, addresses are applied sequentially to a comparator to which the selected address is also applied. When a match occurs, the associated data and address are replicated into the major channel.

The replication of data from a selected one of a plurality of sets of minor loops is implemented by a replicate conductor coupled to the minor loops electrically in series with a tap to permit activation only over a portion of the length of the conductor. The number of stages in the minor loops and the number of stages in the major loop between a detector and the nearest minor loop also is chosen to permit proper placement of data for replication when the detector applies the associated address and that address matches the selected address also applied to the comparator. The organization permits the search to encompass only the address bits resulting in a substantial reduction in access time over that required to search both data and address bits.

DETAILED DESCRIPTION

Figure 1:
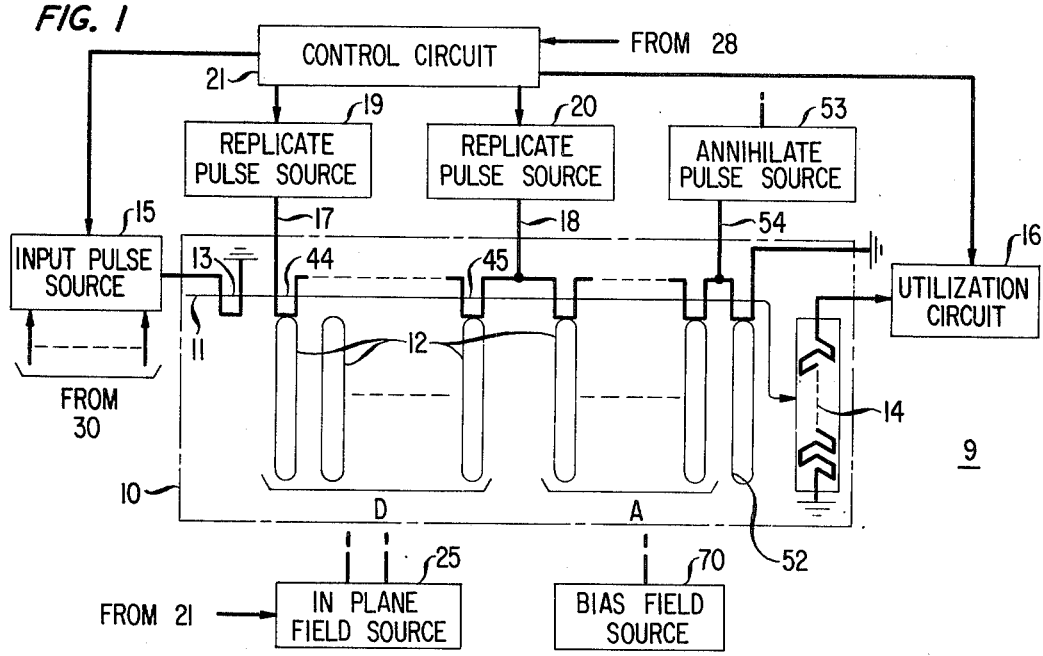
FIG. 1 is a schematic representation of an illustrative "search mode" bubble memory in accordance with this invention.

FIG. 1 shows a memory 9 including a film 10 in which magnetic bubbles can be moved. Bubble movement occurs from left to right, as viewed, along a major channel 11 for movement to and from a plurality of minor loops 12 organized in a familiar major-minor configuration. A magnetic bubble generator 13 couples the left end of the major channel as viewed; an expansion detector 14 couples the right end of the channel. The generator is connected between an input pulse source 15 and ground and the detector is connected between a utilization circuit 16 and ground.

The minor loops are organized into two sets, a data (D) set and an address (A) set. For an illustrative 72 loop arrangement, 64 data loops and eight address loops are used. A replicate conductor 17 couples serially, in a now familiar manner, a stage of each loop where the loops come into close proximity with an associated stage of the major channel.

The replicate arrangement is organized to allow bubble patterns to be replicated from the eight address loops or the eight address plus the 64 data loops selectively. For this purpose, two replicate pulse sources 19 and 20 are connected to replicate conductor 17 and to a tap 18 to the replicate conductor respectively. Sources 19 and 20 pulse conductor 17 and tap 18, selectively under the control of logic control circuit 21. The replicator is conveniently a bidirectional replicator and annihilator of a form well known in the art. A suitable replicator is described in U.S. Pat. No.

3,810,133 of A.H. Bobeck and I. Danylchuk, issued May 7, 1974 and in A.H. Bobeck, R.F. Fischer, J.E. Geusic, and T.J. Nelson, U.S. Pat. No. 3,879,585, issued Apr. 22, 1975.

The minor loops (both data and address loops) store associated data in parallel. That is to say, bits of a word and the address of that word are stored in the like-designated positions of the minor loops and are moved simultaneously into (replicate) stages of those loops which are coupled by the replicate conductor. Thus, when conductor 17 is pulsed by source 19 during a search mode of operation, all data and address bits of a selected word are replicated into the major channel whereas if tap 18 is pulsed alone, only the address bits of a word are replicated.

Consider the operation where, for example, telephone numbers are stored in the minor loops. A telephone number is represented by the storage of a binary encoded 16 digit decimal number. In the present arrangement an eight-bit address tag is associated with each number. An all-zero address is reserved to tag empty word positions. In the illustrative arrangement each minor loop can store 145 bits. Seventeen positions store all zero addresses thus limiting to 128 the number of words (telephone numbers) that can be stored in the illustrative system. As will be described more fully hereinafter, the empty word positions are present in order to provide the ability to write a new word, or rewrite an old word, into memory before an address tag is selected for that new word.

SEARCH OPERATION

During a search operation, only data from address loops is replicated into the major channel. That is, circuit 21 periodically activates pulse source 20 causing replication of successive addresses into the major channel. It is helpful to recall at this juncture that information is moved synchronously in the major channel and in the minor loops by a rotating in-plane field supplied by a source represented by block 25 in FIG. 1. During each cycle of the in-plane field, an address of a word is moved in the minor loops into positions for replication. Every 16th cycle of the in-plane field, during a search mode of operation, source 20 pulses conductor 18 for replicating a next consecutive address (and thus a continuous stream of address bits) into the major channel for movement to expansion detector 14 in the figure, source 25 being activated, in each instance, to advance data 16 stages.

Figure 2:
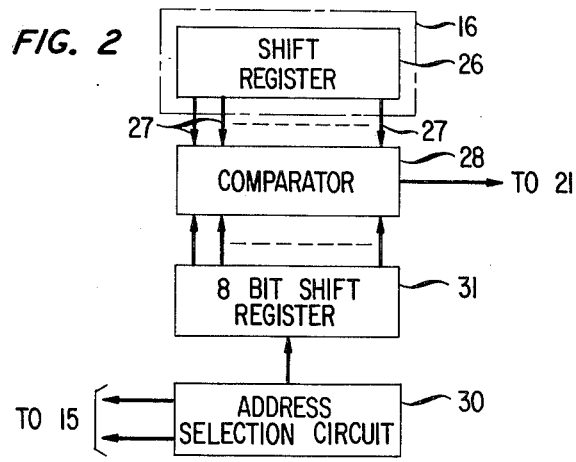
FIG. 2 and 3 are schematic representations of portions of the memory of FIG. 1.

Utilization circuit 16 conveniently comprises a sixteen stage shift register 26 as shown in FIG. 2. Detector 14 is adapted to apply to shift register 26 signals indicative of successive addresses. Shift register 26 also includes eight output ports 27, connected to inputs to a comparator 28. Comparator 28 has a second set of inputs to which externally selected address information is supplied, for example, in response to the depression of a key in a repertory dialer selection array. More generally, inputs may be applied from an external selection arrangement represented by block 30 in FIG. 2 and stored in register 31. Outputs from register 31 are connected to inputs to comparator 28 for comparison with successive address information in major channel 11.

Only when a match occurs between applied data and stored address data does comparator 28 signal control circuit 21 to inhibit source 20 and to activate source 19 on the next cycle. In response, source 19 applies a replicate pulse to conductor 17 causing replication of that data in the minor loops then occupying the replicate positions or stages. Since it is desired that the stored number corresponding to the selected address be replicated at this time, it is helpful to recognize that the correct timing to ensure proper selection is determined by choosing the various bubble paths with correct numbers of stages. To this end, each minor loop has 145 stages. Eight address bits are associated with each of those words and are spaced in minor loops associated with alternate stages of the major channel. The address bits, when replicated there, thus occupy 16 stages. Thus, a replication of an address into the major channel requires data advancement of 16 stages to clear the channel and the minor loops conveniently have a number of stages equal to a multiple of 16+1. Similarly, the major channel includes 128 stages between the detector stage and the stage in the major channel associated with the minor loop (52) closest to the detector. Further, sixteen stages are provided for in register 26. The next succeeding address to be replicated is positioned for movement into the replicators during the cycle of the in-plane field in which a match occurs, circuit 21 inhibiting the next regular address replication responsive to the occurrence of a match. Thus, 145 cycles of the in-plane field occur after an address is replicated before comparator 28 signals circuit 21 to activate source 19 during the following cycle of the drive field for replicating the data associated with that address. This organization requires only 2,320 cycles of the in-plane field to scan the entire memory for a match about one order of magnitude less than required if data and address bits were searched in each instance.

An odd number of stages in the minor loop ensures that precession of the address (words) occurs with respect to a periodic signal (replicate pulse on tap 18). If, for example, the address for word one is first replicated, 16 cycles later the address for word 17 is replicated, then the address for word 33, 49, 65, 81, 97, . . . 145, and then the address for word 16, . . . 32, 48 thus establishing the precession. Consequently, the minor loops have an odd number of stages equal to one plus the number of stages between the detector and the closest minor loop plus the number in the register 26. Although the sequence in which the addresses are compared may not be sequential, all the addresses are compared in a relatively short time. Moreover, the storage locations may be sequential in accordance with an algorithm which stores consecutive words in the first, seventeenth, thirty-third, . . . etc. positions as is a familiar technique in the art.

Control circuit 21 is adapted to deactivate source 25 if a match does not occur within 145×16 cycles of the in-plane field.

WRITE OPERATION

A write operation, in general, is very similar to the read (search) operation and is initiated by applying an all-zero code to comparator 28 by means of address selection circuit 21 of FIG. 2. In response, the memory searches for an (empty) address just as in the read (or search) operation. When an all-zero (or suitable "write") code is found, the generator is pulsed in a manner to write an eight-bit address tag and data word into a succession of (alternate) stages of the major channel. Thereafter, source 19 pulses replicate conductor 17 to replicate the newly written word into the empty address. As before, the relative numbers of stages in the various channels is important in realizing the proper placement of the empty address during a write operation. To ensure this placement, the extreme minor loops and associated replicate couplings 44 and 45 for the data loops in FIG. 1 are spaced apart 143 stages along the major channel. Generator 13 is spaced apart three stages from coupling 44. When an all-zero code is detected, generator 13 starts writing new information. 146 cycles (145+1) later, that information is positioned in the major channel for replication and the empty address is positioned to receive the replicated information when conductor 17 is pulsed at that time. Continued cycling of the drive field advances the written information to detector 14 and, thereafter, through a bubble annihilator which is typically a dynamic guard rail structure as is well known.

The use of an excess number of addresses to provide empty addresses for the storage of new data rather than necessitating the prior elimination of a stored word to empty an address for receiving a newly written word allows implementation with relatively simple and straightforward logic circuits because the same algorithm is employed to rewrite an existing word or to write a new word. This allows the same logic and command to accomplish what would otherwise constitute two operations.

Writing in this mode, of course, requires the later elimination of any previously stored word with the same address as the newly stored word. Since the newly stored word is now in memory, it has to be distinguished from that previously stored word. In order to distinguish a new word, a marker bit is added to the beginning of the address code for each new word. Thus, to address 128 words, only seven data bits are actually required but an additional address bit (there are eight provided) is for the marker. Functionally, the write operation introduces a new word preceded by the marker, a 1. A search places the old word in position for annihilation and subsequently the marker is annihilated. Annihilation occurs in response to an annihilate pulse applied by source 19 to conductor 17 during the appropriate phase of the in-plane field under the control of control circuit 21. The field generated at the coupled positions is operative to collapse bubbles there.

An additional minor loop 52 is shown in FIG. 1 for storing marker indications. Moreover, an annihilate pulse source 53 is connected to a conductor 54 for this purpose. A pulse on conductor 54 results in the annihilation of a marker bubble in loop 52. Input pulse source 15, which may comprise a data assembler (i.e. an 8 to 16 stage shift register) responsive to a dial input, is adapted to hold the address code and marker tap for input.

Figure 3:
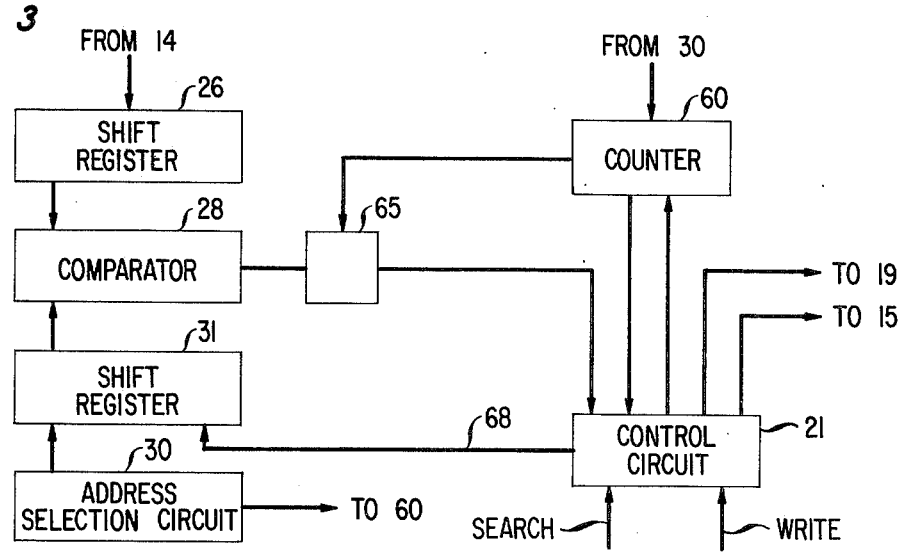

The logic implementation for the write operation is shown generally in FIG. 3. An eight-bit counter 60 is activated by a write command from control circuit 21; source 25 of FIG. 1 is similarly activated. An all-zero address code is then entered into eight-bit shift register circuit 31. Control circuit 21 enables source 19 of FIG. 1 for replicating newly stored information. The comparator circuit (28), however, is disabled for 145 cycles of the in-plane field so that zeros in the major channel do not register as an all-zero code. To this end, counter 60 is connected to gate 65 in the output circuit of comparator 28 for enabling that gate only after a count of 145. When the all-zero code is found, circuit 21 activates source 15 for generating the new information. The new information starts with a tag or marker bit, a seven-bit address code and 64 date bits, the entirety occupying 144 stages of the major channel. After 146 cycles, the new information is properly positioned and circuit 21 activates source 19 to replicate the new word into the minor loops.

Circuit 21 is operative to reset counter 60, when it activates source 19, and to enable counter 60 to count by 16. Circuit 21 is also operative to store the new address in shift register circuit 31 and to enable comparator 21 for a search operation.

When a match occurs (within 145 cycles), the seven address bits (but no tag bit) are annihilated in response to a signal from circuit 21 to source 19. The adaptation of replicate ports for annihilation is acheived, for example, by a shift in the phase of the pulse applied to conductor 17 with respect to the in-plane field as is well known. The search continues until the seven-bit address plus the tag bit are found. A conductor 68 connects circuit 21 and shift register 31 for enabling recognition of the marker bit in comparator 28. At this juncture, comparator 28 signals control circuit 21 to activate source 53 to annihilate the tag bit. The write operation is now complete. The detailed logic circuitry for implementing the various operations herein is similar to that described in the above-mentioned U.S. Pat. No. 3,879,585.

So long as data is accompanied by an address, a power failure or any alteration of the data can only alter two addresses. No catastrophic failures occur. An alteration of address data results, for example, in two stored words having the same address. This is easily corrected by a write operation should a wrong number be dialed as a result.

A bias field source 70 maintains the bubbles in film 10 at a selected operating diameter.

What has been described is considered merely illustrative of the principles of this invention. Therefore, various embodiments can be devised by those skilled in the art in accordance with those principles within the spirit and scope of the invention now claimed.

What is claimed is:

1. A magnetic arrangement comprising a layer of material in which single wall domains can be moved, a pattern of elements coupled to said layer for defining a plurality of multistage closed loops for recirculating domains in said layer in response to a magnetic field reorienting in the plane of said layer, said elements also defining an accessing channel including a detector, said loops being organized into data and address sets, means for periodically moving to said accessing channel address information from first stages of said loops in said address set, and means responsive to the presence of preselected address information for moving the data in the associated stages of said data set into said accessing channel.

2. A magnetic arrangement in accordance with claim 1 comprising first means including an electrical conductor coupled to said first stages of said loops in said data and address sets, and means for selectively activating said conductor in a manner to selectively replicate information in said data and address sets or in said address set alone.

3. A magnetic arrangement in accordance with claim 2 wherein said first means is responsive to a search signal for applying successive addresses from said address set to a comparator after X cycles of said in-plane field and each of said closed loops comprises X+1 stages.

4. A magnetic arrangement in accordance with claim 3 also including means for applying a selected address to said comparator wherein said means responsive to the presence of preselected address information comprises means responsive to a match between said selected address and one of said successive addresses for replicating data in said data set associated with said address into said accessing channel.

5. A magnetic arrangement in accordance with claim 3 including a comparator and comprising means responsive to a write signal and the presence of a suitable write code at said comparator during a first cycle of said in-plane field for generating a new word in said accessing channel, said channel and said loops having relative numbers of stages to permit movement of said word into said loops during the (X+2)nd cycle of said in-plane field.

6. An arrangement in accordance with claim 1 wherein said means for periodically moving is adapted to move bubbles Y cycles of said in-plane field and said address set is organized to compile an address in Y stages of said accessing channel and each of said closed loops has a number of stages M which is a whole number multiple of Y plus an additional stage, said arrangement including addressing means permitting a maximum number of addresses N<M for said arrangement.

7. An arrangement in accordance with claim 6 wherein said address means includes a register having a number of stages S such that $2^S = N$.

* * * * *